United States Patent
Shoji

(10) Patent No.: US 6,366,074 B1
(45) Date of Patent: Apr. 2, 2002

(54) UNIDIRECTIONALITY IN ELECTRONIC CIRCUITS THROUGH FEEDBACK

(75) Inventor: Masakazu Shoji, Warren, NJ (US)

(73) Assignee: Agere Systems Guardian Corp, Miami Lakes, FL (US)

( * ) Notice: Subject to any disclaimer, the term of this patent is extended or adjusted under 35 U.S.C. 154(b) by 0 days.

(21) Appl. No.: 09/534,189

(22) Filed: Mar. 24, 2000

(51) Int. Cl.[7] .......... G01R 19/00; G01R 31/08; G01V 3/16; G01V 3/06
(52) U.S. Cl. ............ 324/76.11; 324/607; 324/330; 324/361; 324/765; 324/512; 324/527
(58) Field of Search ............... 324/76.11, 607, 324/330, 361, 765, 512, 527

(56) References Cited

U.S. PATENT DOCUMENTS

| | | | |
|---|---|---|---|
| 3,652,920 A | * 3/1972 | South et al. | 322/19 |
| 3,675,104 A | * 7/1972 | Allison et al. | 388/819 |
| 3,997,835 A | * 12/1976 | Ando et al. | 324/207.2 |
| 4,341,998 A | * 7/1982 | Castera et al. | 324/244 |
| 5,036,702 A | * 8/1991 | Akamastsu et al. | 73/204.15 |
| 5,221,910 A | * 6/1993 | Tournier | 330/264 |
| 5,519,325 A | * 5/1996 | Park | 325/607 |
| 5,581,584 A | * 12/1996 | Inoue et al. | 375/376 |

* cited by examiner

*Primary Examiner*—Glenn W. Brown
*Assistant Examiner*—Wasseem W. Hamdan
(74) *Attorney, Agent, or Firm*—J. De La Rosa

(57) ABSTRACT

A method for creating signal unidirectionality in electronic circuits is disclosed. This invention describes a method for achieving unidirectionality in an electronic circuit with an input side having a signal source and an output side with a load comprising detecting the current passing through the load on the output side, bypassing a portion of the current passing through the load on the output side, and feeding the bypassed portion of the current on the output side to the input side to achieve unidirectionality. Specifically, unidirectionality in an electronic circuit is accomplished by applying feedback such that the impedance looking into the input of the amplifier is increased. These methods are particularly applicable to negative resistance amplifier circuits.

23 Claims, 3 Drawing Sheets

PRIOR ART
100

UNIDIRECTIONALITY IN ELECTRONIC CIRCUITS THROUGH FEEDBACK

FIELD OF THE INVENTION

The present invention relates to the design of electronic circuits and, more particularly to electronic circuits, such as negative resistance amplifiers employing feedback techniques.

BACKGROUND OF THE INVENTION

It is well known that electron triodes such as vacuum tubes, bipolar transistors and MOSFETs are capable of amplification of signal, but along with amplification, they also provide unidirectionality of signal in the circuit The unidirectionality of an electron triode is based on the conversion mechanism of the information carrier inside the triode. The input voltage signal is converted to the triode current, and the current is converted back to the output voltage at the output node by accumulating it in the output capacitor. The voltage to current conversion mechanism is unidirectional. By forcing current into the triode from the output it never generates voltage at the input electrode. This voltage to current back to voltage conversion creates signal unidirectionality along with the gain of the amplifier. mechanisms are well integrated in the triode, the importance of unidirectionality all by itself has not been well recognized.

As a fundamental matter, the two concepts of amplification and unidirectionality are different concepts. There are amplifying devices that do not have unidirectionality, such as the S-type negative resistance diodes (e.g., a PNPN diode) and the N-type negative resistance diodes (e.g., a tunnel diode). In addition, there are devices such as a microwave isolator or a gyrator which have unidirectionality but no amplification. Yet amplification and unidirectionality have a common character in that they occur only in exceptional circumstances. This is the reason why any idea of generating amplification or unidirectionality is important.

Amplification is characterized by gain. For amplification to be real, the gain must be higher than unity. As for unidirectionality no such clear measure seems to exist. Practically, unidirectionality can be measured only relatively and only partial unidirectionality is realizable in triode circuits.

It is widely known in the art that the unidirectionality mechanisms that exist in electronics and in related areas where the equivalent circuit model is able to describe the dynamic phenomena (examples of such areas are hydraulics logic and bio-logical data processing system consisting of neurons) are as follows: (1) by information carrier conversion (e.g., an electron triode); (2) by burnout mechanisms (e.g., action potential propagation in neurons); (3) by directed transport (e.g., charge coupled devices (CCDs) and parametron logic). Nevertheless, it has been impossible to exhaustively classify the unidirectionality mechanism from these small number of examples.

One device that is well known in the prior art with unidirectionality is the magnetic amplifier that is obsolete today but was used in the past before the 1920s. A magnetic amplifier consists of a transformer having a saturable core 100 is shown in FIG. 1(a). The primary is driven by a DC control current $I_1$, that creates a magnetic flux $\Phi$ by both $I_1$ and $I_2$, and $\Phi$ is a linear function of both. The primary winding 105 has a large number of turns. As $I_1$ increases, the magnetic core saturates by the primary current magnetomotive force only, and $\Phi$ cannot increase any more than the maximum schematically shown in FIG. 1(b). The secondary winding 110 is driven by AC. The impedance looking into the secondary is inductive. If $I_1$ is small, the inductance of the secondary is high. As $I_1$ is increased, however, the core is saturated by the primary magnetomotive force only, and if the AC drive of the secondary is unable to release the core from saturation in any phase of the secondary AC current, the inductance ideally becomes zero. Thus, small primary current is able to control large secondary current. To obtain an ideal operation, it is necessary to keep the series resistance of the secondary winding small. Here, we assume that the copper loss, familiar to one of ordinary skill in the art, is negligible.

The magnetic amplifier is used to amplify signal as follows. The secondary 110 is driven by an AC current source, and the AC voltage developed across the secondary 110 is rectified to recover the low-frequency component that represents the signal. The signal is DC-like, varying slowly compared with the AC power source.

A magnetic amplifier as it is shown in FIG. 1 is not unidirectional. The AC current that drives the secondary 110 generates an AC voltage at the primary terminal. If a magnetic amplifier has high gain, small primary current should be able to create large magnetic flux in the core. This means that the number of turns of the primary 105 must be large, and the number of turns of the secondary 110 is small. Since the AC voltage of the secondary is stepped up to the primary, the AC voltage influences the primary control circuit via the electrical nonlinearity. This is a reverse signal flow through the magnetic amplifier. The primary 105 cannot be by-passed by a capacitor, since that reflects back to the secondary 110. This reverse signal flow can be prevented as follows. As shown in FIG. 2, if two identical nonlinear transformers are connected in series in the primary, and in polarity-inverted series in the secondary, the induced AC voltages at the two primaries cancel, and the reverse signal flow does not occur. This circuit is unidirectional due to clever feedback compensation.

Although methods for achieving unidirectionality with magnetic amplifiers are well known in the art, achieving such unidirectionality in conventional electronic circuitry is not known in the prior art. For example, in a negative resistance amplifier circuit, the input signal source and the amplifier load are directly connected through a two-terminal negative resistance device, and they interact directly. Since the signal flows in either direction, the amplifier circuit is not unidirectional. Thus, there is a need to achieve unidirectionality in conventional electronic circuits such as negative resistance amplifiers.

SUMMARY OF THE INVENTION

Generally, a method for creating signal unidirectionality in electronic circuits is disclosed. The methods described below achieve unidirectionality in an electronic circuit by isolating the input signal source from the rest of the circuit.

This invention describes methods for achieving unidirectionality in an electronic circuit with an input side having a signal source and an output side with a load comprising detecting the current passing through the load on the output side, bypassing a portion of the current passing through the load on the output side, and feeding the bypassed portion of the current on the output side to the input side to achieve unidirectionality. Specifically, unidirectionality in an electronic circuit is accomplished by applying feedback such that the impedance looking into the input of the amplifier is increased. These methods are particularly applicable to negative resistance amplifier circuits.

The amount of unidirectionality is varied by controlling the amount of the bypassed portion of the current passing through the load on the output side. The amount of feedback current can be controlled by the specific design of the elements of the circuit. For instance, the amount of unidirectionality in the circuit may be set to a stable level by reducing the size of the impedances on the input side by a fixed amount compared to the impedances on the output side.

A more complete understanding of the present invention, as well as further features and advantages of the present invention, will be obtained by reference to the following detailed description and drawings.

DETAILED DESCRIPTION OF THE INVENTION

Figure 1:
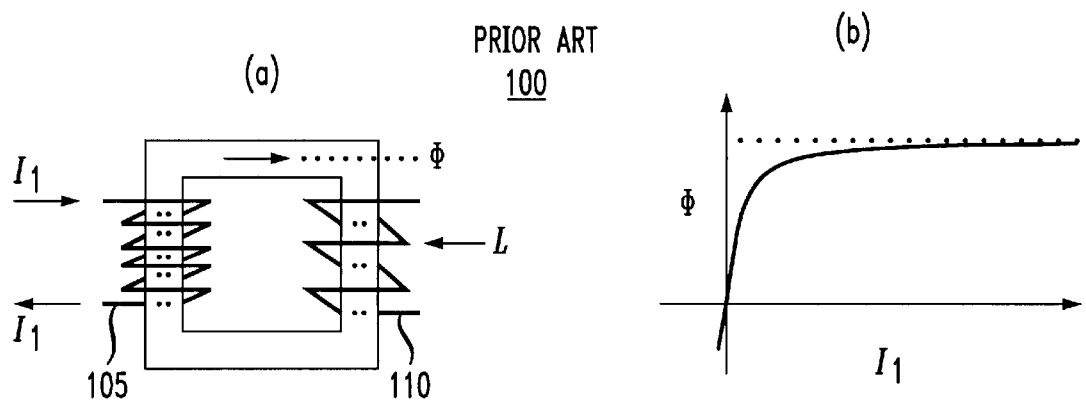
FIG. 1 illustrates the working principle of a magnetic amplifier as is well-known in the prior art.
Figure 2:
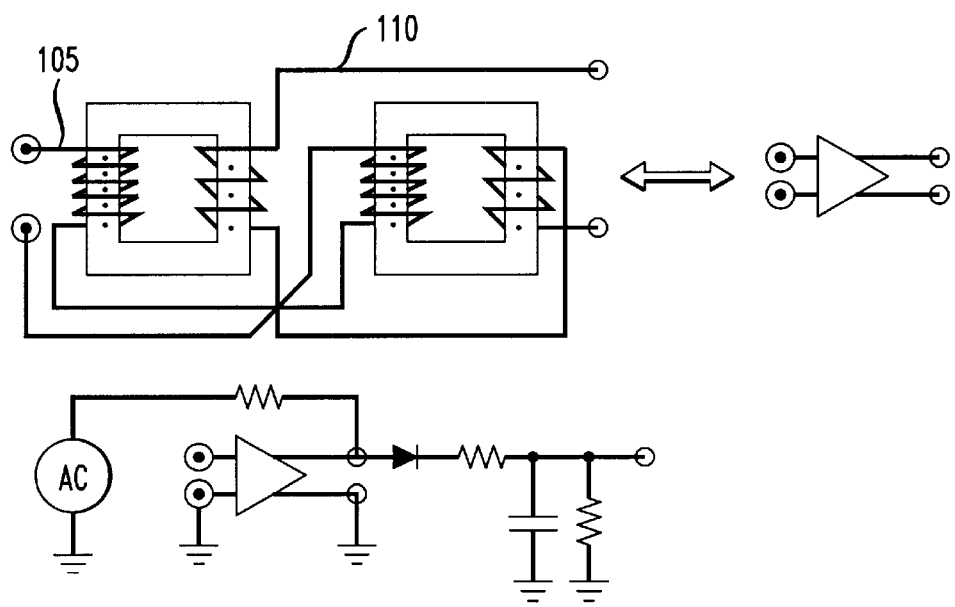
FIG. 2 illustrates a feedback mechanism to achieve unidirectionality in a magnetic amplifier as is well-known in the prior art.
Figure 3:
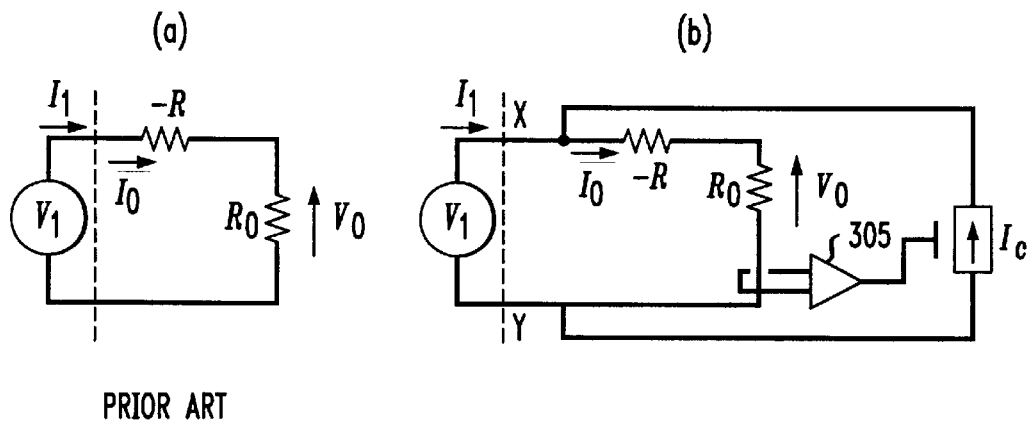
FIG. 3(a) illustrate the working principles of a prior art negative resistance amplifier circuit.
FIG. 3(b) illustrates a feedback mechanism implemented in the negative resistance amplifier circuit of FIG. 3(a) so as to achieve unidirectionality in accordance with present invention.

FIG. 3(a) shows how the input signal source and the amplifier load interact in a negative resistance amplifier circuit. In FIG. 3(a), the signal source $V_1$ drives a series connection of negative resistance $-R$, and amplifier load $R_0$. $-R$ and $R_0$ make a voltage divider of the input voltage $V_1$. The signal voltage is increased instead of being attenuated because one of the resistances is negative. The voltage source generates current $I_0$ and output voltage $V_0$ is given by:

$$I_0 = V_1/(R_0-R); \quad V_0 = [R_0/(R_0-R)]V_1$$

where $V_0 > V_1$. Current $I_0$ flows through both $R_0$ and the signal source and it is the common information-carrying variable to the input and to the output of this circuit. Since the same current flows, the input and the output couple perfectly. This is not a desirable attribute of an amplifier.

To reduce the coupling between the input and output sides in the circuit, the current flowing through the signal source is reduced while maintaining the current of the output circuit. In the limiting condition, as shown schematically in FIG. 3(b), as the input current is reduced to zero, complete input-output isolation or unidirectionality is attained. In the circuit shown in FIG. 3(b), there is a current detector 305 shown by the small loop with an amplifier symbol. The amplifier drives the current generator $I_C$ that is proportional to $I_0$. Current generator $I_C$ is connected at node X and Y. If $I_C = \alpha I_0$ where $0 < \alpha < 1$ we have:

$$I_1 = I_0 - I_C = (1-\alpha)I_0$$

and the current supplied by the signal source $I_0$ is reduced. In the limit as $\alpha \to 1, I_1 = 0$. In the limit, both unidirectionality and voltage gain are achieved. As $\alpha$ increases, the impedance looking into the amplifier from the signal source at the low frequencies diverges. This limit is, however, a singular limit. Since $I_1 = 0$ as the limit is reached, the amplifier draws no information-carrying current from the signal source and what appears on the output side is noise. Therefore, as a practical matter, the true limit of $\alpha = 1$ is not attainable.

Figure 4:
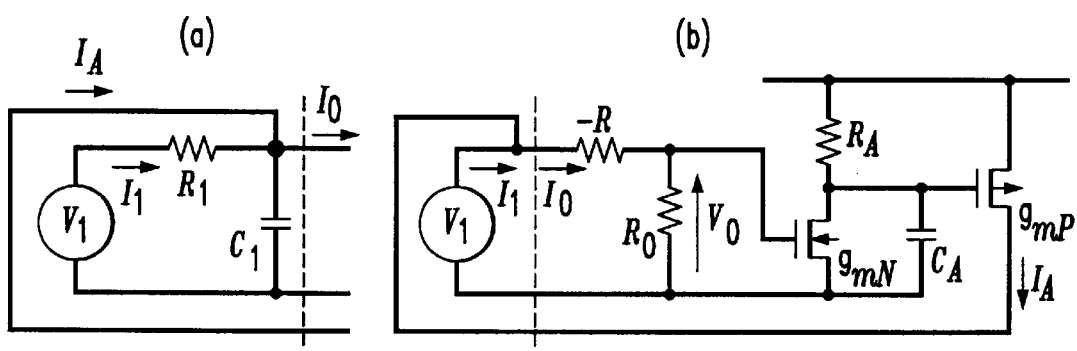
FIG. 4 depicts a unidirectional negative resistance amplifier in accordance to this invention.

FIG. 4(a) shows a unidirectionalized negative resistance amplifier. In this circuit only the essential parasitic capacitance are retained. The negative resistance amplifier itself has no parasitic capacitance, and the delay of the current sensing-regenerating circuit is modeled by one-stage amplifier having a capacitive load $C_A$. This circuit model is adequate to observe basic circuit operations, but not appropriate to analyze details, such as stability of the circuit. The circuit in FIG. 4(a) is described by the following set of equations:

$$I_0 = I_1 + I_A; \quad V_1 = (R_0 - R)I_0; \quad V_0 = R_0 I_0$$

$$C_A \frac{dV_A}{dt} = \frac{V_{DD} - V_A}{R_A} - g_{mN}V_0; \quad I_A = g_{mP}(V_{DD} - V_A)$$

where the N-type and P-type triodes are modeled using the collapsable current generator model having zero conduction threshold voltage and having transconductances $g_{mN}$ and $g_{mp}$ respectively. The equations to the input waveform $V_1$ are given by:

$$V_1(t) = 0 \ (t<0) \text{ and } V_1(t) = \Delta V_1 \ (t \geq 0)$$

The set of equations are combined to yield:

$$C_A \frac{dV_A}{dt} + \frac{V_A}{R_A} = \frac{V_{DD}}{R_A} - \frac{g_{mN}R_0}{R_0 - R}V_1(t)$$

and this equation is solved subject to the initial condition $V_A(+0) = V_{DD}$ as $$V_A(t) = V_{DD} - [g_{mN}R_0 R_A \Delta V_1/(R_0-R)][1-\exp(-t/C_A R_A)] \quad (1)$$

and the injected current IA (t) is given by:

$$I_A(t) = g_{mP}(V_{DD} - V_A) = \frac{g_{mN}g_{mP}R_o R_A}{R_N - R}\Delta V_1 [1 - \exp(-t/C_A R_A)]$$

The circuit is described to be designed such that the following condition is satisfied:

$$\lim_{t \to \infty} I_A(t) = \Delta V_1 / (R_0 - R)$$

This is the requirement that the current compensation is complete for slow input signal transient. Then, $$g_{mN}g_{mP}R_0 R_A = 1$$

Equation (1) shows that current compensation takes place only after delay time $C_A R_A$ in the ideal condition. The circuit of FIG. 4(a) is an unidirectional amplifier only if the input signal transient is slower than the response time of the compensation circuit.

Next, we can compute the impedance looking into the amplifier circuit from the signal source. By eliminating VA among the set of circuit equations we have:

$$C_A \frac{dI_A}{dt} + \frac{I_A}{R_A} = g_{mN} g_{mP} V_0$$

By using substitution $d/dt \to j\omega$ we have:

$$I_A = \frac{g_{mN} g_{mP} R_A}{1 + j\omega C_A R_S} V_0$$

Therefore, $$Z_1 = \frac{V_1}{I_1} = (R_0 - R) \frac{1 + j\omega C_A R_A}{(1 - g_{mN} g_{mP} R_A R_0) + j\omega C_A R_A} = $$
$$(R_0 - R)[1 + (1/j\omega C_A R_A)] \to (R_0 - R)/j\omega C_A R_A$$

and at low frequencies the amplifier is equivalent to a capacitance $C_A[R_A|(R_0-R)]$. As the frequency increases, the capacitive impedance decreases, and the amplifier loses unidirectionality. Note here that the impedance looking into a triode is also capacitive. In the circuit, an electron triode was synthesized using the negative resistance diode and the triode.

The stability of the circuit can be analyzed by a more elaborated circuit model than FIG. 4(a), in which the circuit to the left of the dotted line in FIG. 4(a) is replaced by FIG. 4(b).

This circuit includes all the capacitive parasitics of the triode section of the circuit, and the negative resistance amplifier has zero delay (it does not make practical sense to unidirectionalize a slow negative resistance amplifier using fast triodes). The circuit includes, the internal resistance of the signal source $R_1$ required for a stability analysis. The drain capacitance of the PFET modeled by $C_1$ defines a new node voltage $V_X$ developed across it. The circuit equations are as follows:

$$I_1 + I_A = I_0 = C_1 \frac{dV_X}{dt} C_A \frac{dV_A}{dt} + g_{mN} V_0 = \frac{V_{DD} - V_{aubA}}{R_A}$$

All the variables except for $V_A$ and $V_X$ are eliminated among them, and we then obtain:

$$C_A(dV_A/dt) + (V_A|R_A) + g_{mN}[R_0|(R_0-R)]V_X = (V_{DD}|R_A)$$

$$G_{mP} V_A + C_1(dV_X/dt) + [1|(R_0-R) + (1|R_1)]V_X = g_{mP} V_{DD} + (V_1|R_1)$$

Figure 5:
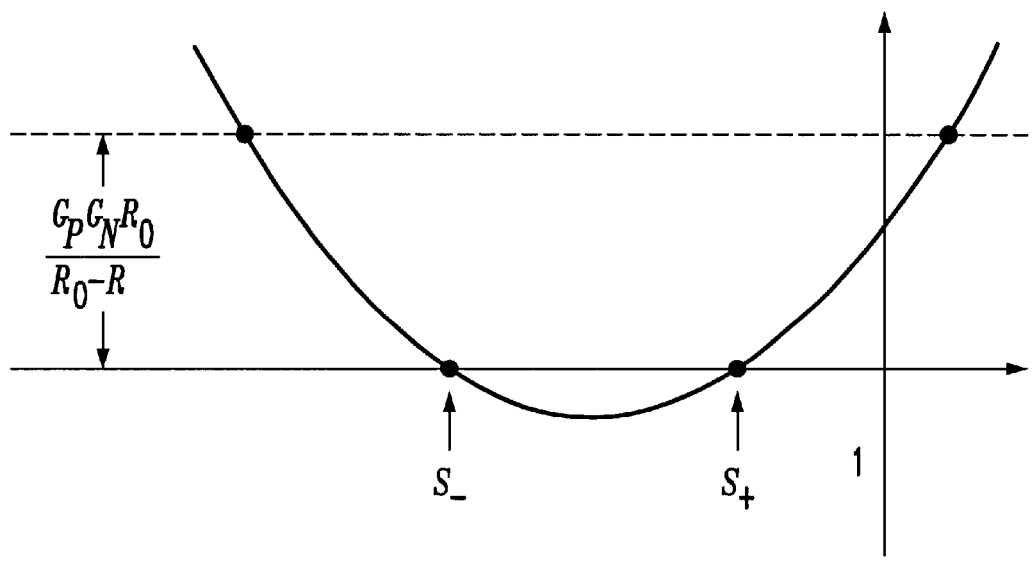
FIG. 5 shows a graphical solution to the secular equation and plots F(S) as a function of S.

The homogeneous part of the set of equations are obtained by setting the right-hand sides zero. In the homogeneous equations, if $V_A$ and $V_X$ depend on time like $\exp(St)$, $S$ satisfies the secular equation:

$$F(S) = (C_A R_A)(C_1 R_P) S^2 + [(C_A R_A) + (C_1 R_P)] S + 1 = G_N G_P[R_0|(R_0-R)]$$

where $(1|R_P) = [1|(R_0-R)] + (1|R_1)$ is the resistance in parallel with capacitance $C_1$. $G_N = g_{mN} R_A$ and $G_P = g_{mP} R_P$ are the gains of the N-type and P-type triode amplifier stages. $(C_A R_A)$ and $(C_1 R_P)$ are the time constants of the cascaded amplifying stages. FIG. 5 shows a plot of the secular equation wherein F(S) is plotted versus S. The rate of growth/decay of the exponential terms, $S_+$ and $S_-$ are the solutions of the secular equation. If any of $G_N$ or $G_P$ is zero, then $$S_+, S_- = -1|(C_A R_A) \text{ or } -1(C_1 R_P)$$

If $G_N G_P = 0$, the solutions are given by the intersection of the F(S) curve, a parabola, and a horizontal line having height $[R_0|(R_0-R)]G_N G_P$. Since $F(0)=1$, if $$[R_0|(R_0-R)]G_N G_P > 1$$

$S_+$ becomes positive, and the circuit works as a latch. In this formula $R_0|(R_0-R)$ is the gain of the negative resistance amplifier. The left-hand side is the closed-loop gain of the three cascaded stages, two of them are inverting and the one non-inverting. If the loop gain is less than unity, the circuit is stable, and partial input isolation is accomplished.

From the above analysis, it is clear that unidirectionality in a negative resistance amplifier can be accomplished by applying feedback such that the impedance looking into the input of the amplifier is increased.

A concept that might be considered similar to this concept is the emitter follower circuit. In an emitter follower circuit, the base and the emitter voltage is maintained practically constant, and therefore, the effective input capacitance of a triode is reduced. An emitter follower is, however, already unidirectional, and the feedback effect is to reduce the output-to-input coupling. This invention describes a concept that creates unidirectionality to an amplifier that is originally not unidirectional. The two circuits appear to do the same thing, but they are fundamentally different.

Figure 6:
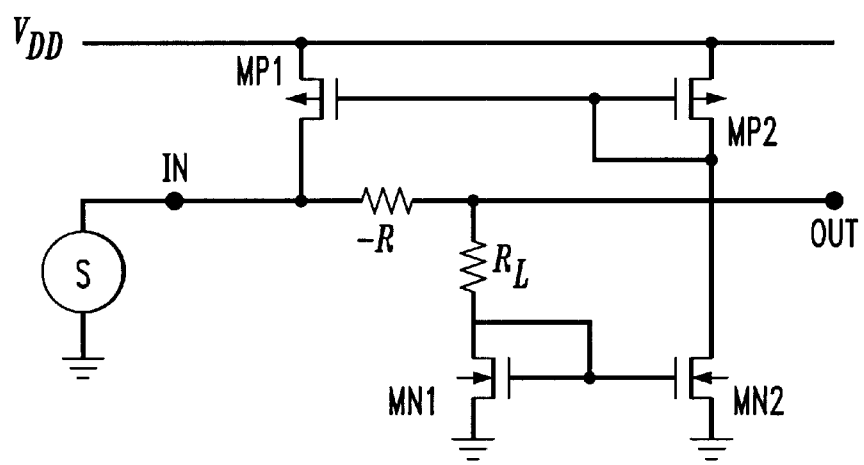
FIG. 6 depicts a practical implementation of a unidirectional negative resistance amplifier in accordance to this invention.

In the unidirectionality creation scheme, the limit of complete compensation is unreachable, and the circuit that is compensated close to it is unstable and unreliable. The degree of compensation must be set precisely by the circuit structure. FIG. 6 shows a practical implementation of the unidirectional negative resistance amplifier of the present invention. In the circuit shown in FIG. 6, the current is detected by an NFET current mirror circuit, and the compensation can be adjusted by scaling the sizes of FETs MN1, MN2, MP1 and MP2. If the FETs, MN1 and MN2 are identical and so are the FETs, MP1 and MP2, the critical compensation is reached. Then by reducing the size of MP1 by 10% the amplifier is set at the stable operation condition. The matched current mirror circuit is precise, and it is ideal for this purpose. Moreover, the current mirror circuit response is fast, if MOSFETs MN1–MP2 are replaced by fast bipolar transistors (BJTs). This is ideal for increasing speed of the negative resistance amplifier.

It is to be understood that the embodiments shown and described herein are merely illustrative of the principles of this invention and that various modifications may be implemented by those skilled in the art without departing from the scope and spirit of the invention.

I claim:

1. A method for achieving unidirectionality in an electronic circuit with an input side having a signal source and an output side with a load comprising:
   detecting the current passing through the load on the output side;
   bypassing a portion of the current passing through the load on the output side; and
   feeding the bypassed portion of the current on the output side to the input side to achieve unidirectionality.

2. The method of claim 1, wherein the amount of unidirectionality is varied by controlling the amount of the bypassed portion of the current passing through the load on the output side.

3. The method of claim 1, wherein the amount of the bypassed portion of the current passing through the load on the output side that is fed back to the input side is increased until the circuit begins to oscillate.

4. The method of claim 1, wherein the amount of unidirectionality in the circuit is set to a stable level by reducing the size of the impedances on the input side by a fixed amount compared to the impedances on the output side.

5. The method of claim 1, wherein the amount of unidirectionality in the circuit is varied by changing the size of the impedances on the input side compared to the impedances on the output side.

6. The method of claim 1, wherein the electronic circuit is a negative resistance amplifier.

7. A method for achieving unidirectionality in an electronic circuit with an input side having a signal source and an output side with a load comprising:

detecting the current passing through the load on the output side;

bypassing a portion of the current passing through the load on the output side;

feeding the bypassed portion of the current on the output side to the input side; and thereby increasing the impedance of the circuit as seen from the input side to achieve unidirectionality.

8. The method of claim 7, wherein the amount of unidirectionality is varied by controlling the amount of the bypassed portion of the current passing through the load on the output side.

9. The method of claim 7, wherein the amount of the bypassed portion of the current passing through the load on the output side that is fed back to the input side is increased until the circuit begins to oscillate.

10. The method of claim 7, wherein the amount of unidirectionality in the circuit is varied by changing the size of the impedances on the input side compared to the impedances on the output side.

11. The method of claim 7, wherein the amount of unidirectionality in the circuit is set to a stable level by reducing the size of the impedances on the input side by a fixed amount compared to the impedances on the output side.

12. The method of claim 7, wherein the electronic circuit is a negative resistance amplifier.

13. A unidirectional electronic circuit with an input side having a signal source and an output side with a load comprising:

a detector to determine the current passing through the load on the output side;

a bypass circuit to shunt a portion of the current passing through the load on the output side; and a circuit to feedback the bypassed portion of the current on the output side to the input side to achieve unidirectionality.

14. The circuit of claim 13, wherein the amount of unidirectionality can be varied by controlling the amount of the bypassed portion of the current passing through the load on the output side.

15. The circuit of claim 13, wherein the amount of the bypassed portion of the current passing through the load on the output side that is fed back to the input side is increased until the circuit begins to oscillate.

16. The circuit of claim 13, wherein the amount of unidirectionality in the circuit is varied by changing the size of the impedances on the input side compared to the impedances on the output side.

17. The circuit of claim 13, wherein the amount of unidirectionality in the circuit is set to a stable level by reducing the size of the impedances on the input side by a fixed amount compared to the impedances on the output side.

18. The circuit of claim 13, wherein the electronic circuit is a negative resistance amplifier.

19. A unidirectional electronic circuit with an input side having a signal source and an output side with a load comprising:

a detector to determine the current passing through the load on the output side;

a bypass circuit to shunt a portion of the current passing through the load on the output side; and a circuit to feedback the bypassed portion of the current on the output side to the input side and thereby increasing the impedance of the circuit as seen from the input side to achieve unidirectionality.

20. The circuit of claim 19, wherein the amount of unidirectionality can be varied by controlling the amount of the bypassed portion of the current passing through the load on the output side.

21. The circuit of claim 19, wherein the amount of unidirectionality in the circuit is varied by changing the size of the impedances on the input side compared to the impedances on the output side.

22. The circuit of claim 19, wherein the amount of unidirectionality in the circuit is set to a stable level by reducing the size of the impedances on the input side by a fixed amount compared to the impedances on the output side.

23. The circuit of claim 19, wherein the electronic circuit is a negative resistance amplifier.

* * * * *